(12) United States Patent
Yamabuchi et al.

(10) Patent No.: US 7,826,231 B2
(45) Date of Patent: Nov. 2, 2010

(54) POWER CONVERSION APPARATUS

(75) Inventors: Hiroshi Yamabuchi, Tokyo (JP); Yuji Kuramoto, Tokyo (JP); Hirotoshi Maekawa, Tokyo (JP); Ryoji Nishiyama, Tokyo (JP)

(73) Assignee: Mitsubishi Electric Company, Tokyo (JP)

( * ) Notice: Subject to any disclaimer, the term of this patent is extended or adjusted under 35 U.S.C. 154(b) by 908 days.

(21) Appl. No.: 11/642,512

(22) Filed: Dec. 21, 2006

(65) Prior Publication Data
US 2007/0183130 A1    Aug. 9, 2007

(30) Foreign Application Priority Data
Feb. 6, 2006    (JP)    ............... 2006-028666

(51) Int. Cl.
*H01R 9/00*    (2006.01)
(52) U.S. Cl. ............... 361/775; 361/782; 361/784; 439/76.2
(58) Field of Classification Search ......... 361/775–784; 439/76.2
See application file for complete search history.

(56) References Cited

U.S. PATENT DOCUMENTS

| | | |
|---|---|---|
| 5,347,158 A | 9/1994 | Matsuda et al. |
| 5,751,058 A * | 5/1998 | Matsuki ............... 257/692 |
| 6,060,772 A * | 5/2000 | Sugawara et al. ............ 257/678 |
| 6,421,244 B1 * | 7/2002 | Shinohara et al. ............ 361/736 |
| 6,778,389 B1 | 8/2004 | Glovatsky et al. |

FOREIGN PATENT DOCUMENTS

| | | |
|---|---|---|
| JP | 61-092174 | 5/1986 |
| JP | 10-229681 | 8/1998 |
| JP | 2001-211661 A | 8/2001 |
| JP | 2001-211663 A | 8/2001 |
| JP | 2002-119069 A | 4/2002 |
| JP | 2003-324903 A | 11/2003 |
| JP | 2004-153897 A | 5/2004 |
| JP | 2004-215340 A | 7/2004 |
| JP | 2004-282804 A | 10/2004 |
| JP | 2005-85958 A | 3/2005 |
| WO | 00/17994 A1 | 3/2000 |

* cited by examiner

*Primary Examiner*—Tuan T Dinh
(74) *Attorney, Agent, or Firm*—Sughrue Mion, PLLC

(57) ABSTRACT

A power conversion apparatus comprising a base which includes a first fixation portion and a second fixation portion that are coupled to each other at a desired angle, wherein power modules are fixed on the first fixation portion of the base, a control circuit board is fixed with its first principal surface held in direct or indirect touch with the second fixation portion of the base, and components constituting a control circuit are packaged on the second principal surface of the control circuit board. Owing to the configuration, a versatility for the installation of the power conversion apparatus on a vehicle becomes high, the vibration-proofness of the control circuit board is enhanced, and heats generated by the electronic components, etc. packaged on the control circuit board are sufficiently emitted.

13 Claims, 7 Drawing Sheets

POWER CONVERSION APPARATUS

BACKGROUND OF THE INVENTION

1. Field of the Invention

This invention relates to a power conversion apparatus which controls an AC motor for driving, for example, a vehicle, and more particularly to the mechanical configuration thereof.

2. Description of the Related Art

In general, a power conversion apparatus for controlling the driving motor of a vehicle in a hybrid automobile, an electric automobile or the like includes as its principal constituents, power modules each of which includes power semiconductor elements for converting powers between DC and AC, a control circuit board on which components constituting a control circuit for controlling the power semiconductor elements of the power modules are packaged, a smoothing capacitor, and bus bars which electrically connect the power modules and the motor. The constituents are arranged and fixed in correspondence with the mounting structure of the vehicle.

In such a power conversion apparatus, there has been a prior-art apparatus wherein, in view of increase in the number of the power modules (IPMs) to-be-installed in which the power semiconductor elements for converting the powers are included, the IPMs are vertically erected and are arranged and fixed so that they can be arranged without enlarging a floor area. (Refer to, for example, JP-A-2004-215340 which shall be called "Patent Document 1" below.)

Further, there has been a prior-art apparatus wherein the resin-molded plate portion of a plate having built-in bus bars is provided with a central support post, and the central support post is held in abutment on the tentative surface of a printed circuit board on which the control circuit is packaged, so as to suppress the vibrations of the printed circuit board. (Refer to, for example, JP-A-2003-324903 which shall be called "Patent Document 2" below.)

In addition, there has been a prior-art apparatus wherein pins for the control signals of the switching semiconductor element modules are formed with crooked portions each of which is endowed with a flexibility by a bending work, so as to absorb displacements developing due to vibrations or the difference of thermal expansions, by the crooked portions. (Refer to, for example, JP-A-2005-85958 which shall be called "Patent Document 3" below.)

Regarding an equipment which is installed on a vehicle, however, a space allowed for the installation is severely restricted. A versatility for the installation on the vehicle is not always high, merely by the contrivance in which the elements constituting the equipment are arranged substantially vertically as in the prior-art apparatus stated in Patent Document 1. Further, in the prior-art apparatus, the control circuit board for controlling the drives of the power modules (IPM drive circuit board) is fixed on a base side through a cover member, and any configurational consideration for enhancing vibration-proofness is not made.

Besides, according to the prior-art apparatus stated in Patent Document 2, the printed circuit board is not supported at any part other than its peripheral edge part and the part abutting on the central support post. Accordingly, a resonance point ascribable to the vibrations is inevitably existent, and displacements caused by the resonance of the printed circuit board attributed to the resonance frequency of the resonance point develop, so that electric components and electronic components packaged on the printed circuit board, or structural components are apprehended to damage or fall off.

Further, the prior-art apparatus has not a structure which emits heats generated by the electronic components, etc. packaged on the control circuit board, and it is problematic in durability and reliability.

Besides, in the prior-art apparatus stated in Patent Document 3, the pins for the control signals as are disposed in the power modules including the switching semiconductor elements include the crooked portions each of which has been subjected to the bending work so as to ensure the flexibility.

In general, however, it is difficult to perform a work of high precision by the bending work. In an assembling structure which requires a comparatively minute dimensional precision as in case of inserting the control signal pins of the power modules into holes provided in a printed circuit board, as in the power conversion apparatus which is installed on the vehicle, there is the problem that all the pins cannot be inserted due to dimensional deviations in some cases.

SUMMARY OF THE INVENTION

This invention has been made in order to solve the above problems in the prior-art apparatuses, and has for its object to obtain a power conversion apparatus which is installed on the mounting location of a vehicle or the like at a high versatility, and whose vibration-proofness and cooling effect are high.

A power conversion apparatus according to this invention consists in a power conversion apparatus including power modules which include semiconductor elements constituting a power conversion circuit for converting powers between DC and AC, a control circuit board on which components constituting a control circuit for driving and controlling the semiconductor elements are packaged, bus bars which connect the power conversion circuit and an external equipment, and a base on which, at least, the power modules and the control circuit board are fixed; wherein the base includes a first fixation portion and a second fixation portion which are coupled to each other at a desired angle, the power modules are fixed on the first fixation portion of the base, the control circuit board is fixed with its first principal surface held in direct or indirect touch with the second fixation portion of the base, and the components are packaged on a second principal surface of the control circuit board.

In this invention, the "desired angle" signifies an angle which is set in consideration of the structural restrictions etc. of an installation space or installation location where the power conversion apparatus is installed, in a vehicle by way of example. Although the angle is optional, it should desirably be an angle other than 180 degrees.

Besides, a power conversion apparatus according to this invention consists in a power conversion apparatus including a plurality of pairs of power modules which include semiconductor elements constituting a power conversion circuit for converting powers between DC and AC, a plurality of control circuit boards on which components constituting control circuits for driving and controlling the semiconductor elements are packaged, bus bars which connect the power conversion circuit and an external equipment, and a base on which, at least, the power modules and the control circuit boards are fixed; wherein the base includes a first fixation portion, a second fixation portion which is coupled to one end of the first fixation portion, and a third fixation portion which is coupled to the other end of the first fixation portion; the first fixation portion and the second fixation portion, and the first fixation portion and the third fixation portion are respectively coupled to each other at desired angles; the plurality of pairs of power modules are fixed on the first fixation portion of the base; at least one of the plurality of control circuit boards is fixed with its first principal surface held in direct or indirect touch with the second fixation portion of the base; the components are packaged on a second principal surface of such one control circuit board; at least one other control circuit board is fixed with its first principal surface held in direct or indirect touch with the third fixation portion of the base; and the components are packaged on a second principal surface of such other control circuit board.

In this invention, the "desired angles" signify angles which are set in consideration of the structural restrictions etc. of an installation space or installation location where the power conversion apparatus is installed, in a vehicle by way of example. Although the angles are optional, they should desirably be angles other than 180 degrees.

In accordance with the power conversion apparatus according to this invention, the base includes the first fixation portion and second fixation portion which are respectively flat, and which are coupled to each other at the desired angle. Therefore, the power conversion apparatus can be endowed with the optimum configuration corresponding to the situation of the mounting space, and it is permitted to increase the versatility of the installation of the apparatus in the vehicle of many spatial restrictions, especially an engine room or the like. Moreover, the control circuit board is fixed with its first principal surface held in direct or indirect touch with the second fixation portion of the base. Therefore, the rigidity of the control circuit board becomes high, and the vibration-proofness and cooling effect thereof can be enhanced.

Besides, in accordance with the power conversion apparatus according to this invention, even in the case where the plurality of pairs of power modules and the plurality of control circuit boards are included, the power conversion apparatus can be endowed with the optimum configuration corresponding to the situation of the mounting space, and it is permitted to increase the versatility of the installation of the apparatus in the vehicle of many spatial restrictions, especially an engine room or the like. In addition, the rigidities of the control circuit boards become high, and the vibration-proofness and cooling effects thereof can be enhanced.

The foregoing and other object, features, and advantages of the present invention will become more apparent from the following detailed description of the present invention when taken in conjunction with the accompanying drawings.

DESCRIPTION OF THE PREFERRED EMBODIMENTS

Embodiment 1

Figure 1:
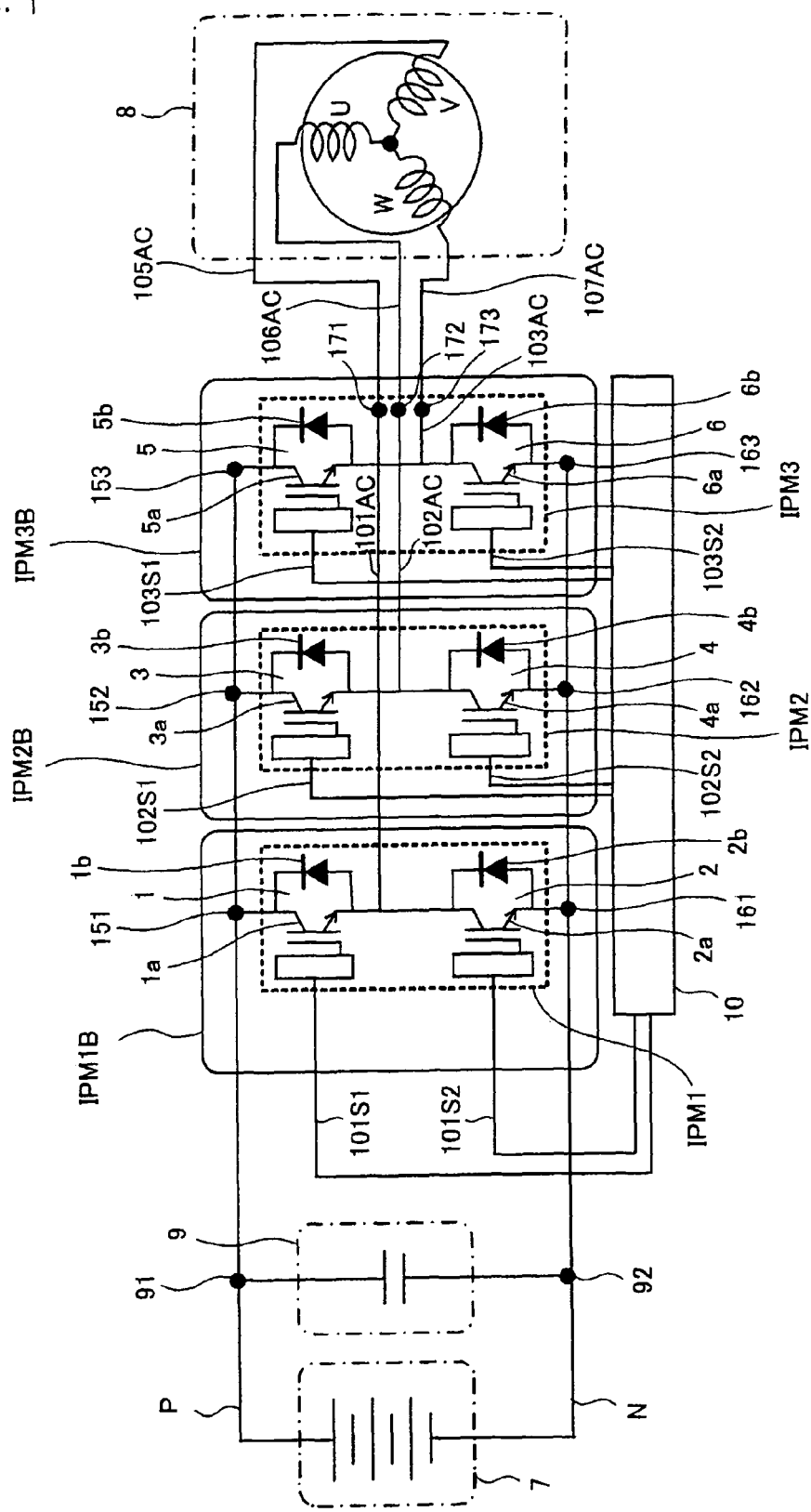
FIG. 1 is an explanatory diagram showing the schematic circuit arrangement of a power conversion apparatus according to Embodiment 1 of this invention.

FIG. 1 is an explanatory diagram showing the schematic arrangement of a power conversion circuit. Referring to FIG. 1, a semiconductor element (Insulated Gate Bipolar Transistor: hereinbelow, abbreviated to "IGBT") $1a$ in which a MOS field effect transistor and a bipolar transistor are combined into one chip, and a flywheel diode $1b$ are connected in parallel, thereby to constitute a pair of power semiconductor elements 1. Likewise, IGBTs $2a$, $3a$, $4a$, $5a$ and $6a$ and flywheel diodes $2b$, $3b$, $4b$, $5b$ and $6b$ corresponding to the IGBTs are connected in parallel, thereby to constitute pairs of power semiconductor elements 2, 3, 4, 5 and 6, respectively.

The power semiconductor elements 1, 3 and 5 form the upper arms of three-phase bridge circuits constituting the power conversion circuit, and the power semiconductor elements 2, 4 and 6 form the lower arms thereof, respectively. Besides, the power semiconductor elements 1 and 2, 3 and 4, and 5 and 6 are respectively connected in series, and the series connection points are respectively connected to the stator windings U, V and W of a brushless DC motor 8 through bus bars 106AC, 105AC and 107AC. The power semiconductor elements 1 and 2, 3 and 4, and 5 and 6 are respectively integrated, thereby to constitute power modules IPM1, IPM2 and IPM3 which are the minimum units performing the powering and regeneration of the AC motor 8. Incidentally, signs IPM1B, IPM2B and IPM3B denote the bottom surfaces of the respectively corresponding power modules IPM1, IPM2 and IPM3.

The power modules IPM1, IPM2 and IPM3 have their P-electrode side main terminals connected to the P-electrode of a battery 7 being a DC power source, through a bus bar by screws 151, 152 and 153, and have their N-electrode side main terminals connected to the N-electrode of the battery 7 through a bus bar by screws 161, 162 and 163, respectively, as will be explained later. Besides, a smoothing capacitor 9 is connected between the P-electrode and N-electrode of the battery 7 by connection parts 91 and 92. The smoothing capacitor 9 absorbs those ripple fluctuations of the DC power of the battery 7 which develop when the power semiconductor elements 1 and 2, 3 and 4, and 5 and 6 perform switching operations.

A control circuit board 10 is disposed in a manner to be mechanically independent of the power modules IPM1, IPM2 and IPM3, and electric components, electronic components, etc. which constitute a control circuit not shown are packaged on the control circuit board 10. The control circuit provided on the control circuit board 10 is electrically connected to all of the signal electrode terminals 101S1 and 101S2, 102S1 and 102S2, and 103S1 and 103S2 of the respectively corresponding power modules IPM1, IPM2 and IPM3, so as to subject the power semiconductor elements 1 and 2, 3 and 4, and 5 and 6 to switching controls. The AC side main terminals 101AC, 102AC and 103AC of the power modules IPM1, IPM2 and IPM3 are respectively connected to the bus bars 105AC, 106AC and 107AC by screws 181, 182 and 183 as will be explained later.

The power modules PM1, PM2 and PM3 which include the three-phase bridge circuits consisting of the power semiconductor elements 1 and 2, 3 and 4, and 5 and 6, respectively, and the control circuit board 10 which includes the control circuit, constitute a power conversion apparatus which performs the power conversion between DC and AC.

The power conversion apparatus shown in FIG. 1 is such that the three power modules IMP1, IMP2 and IMP3 are connected in parallel so as to drive one brushless DC motor 8. More specifically, the IGBTs 1a and 2a, 3a and 4a, and 5a and 6a of the power modules IPM1, IPM2 and IPM3 are respectively subjected to switching controls by control signals from the control circuit provided on the control circuit board 10, whereby the brushless DC motor 8 is rotated forward or reversely at a desired speed by, for example, a PWM (Puls Wide Modulation) control.

When the IGBTs 1a and 2a, 3a and 4a, and 5a and 6a of the respective power modules IPM1, IPM2 and IPM3 repeat ON and OFF operations in accordance with the PWM control, ripple powers being the drifts of currents develop in the DC power systems on the sides of the battery 7, of the three-phase bridge circuits respectively composed of the power semiconductor elements 1 and 2, 3 and 4, and 5 and 6, thereby to incur degradation in the lifetime of the battery 7. For the purpose of suppressing the ripple powers of the drifts, therefore, the smoothing capacitor 9 is connected in parallel between the P- and N-electrodes of the battery 7 so as to prolong the lifetime of the battery 7.

Figure 2:
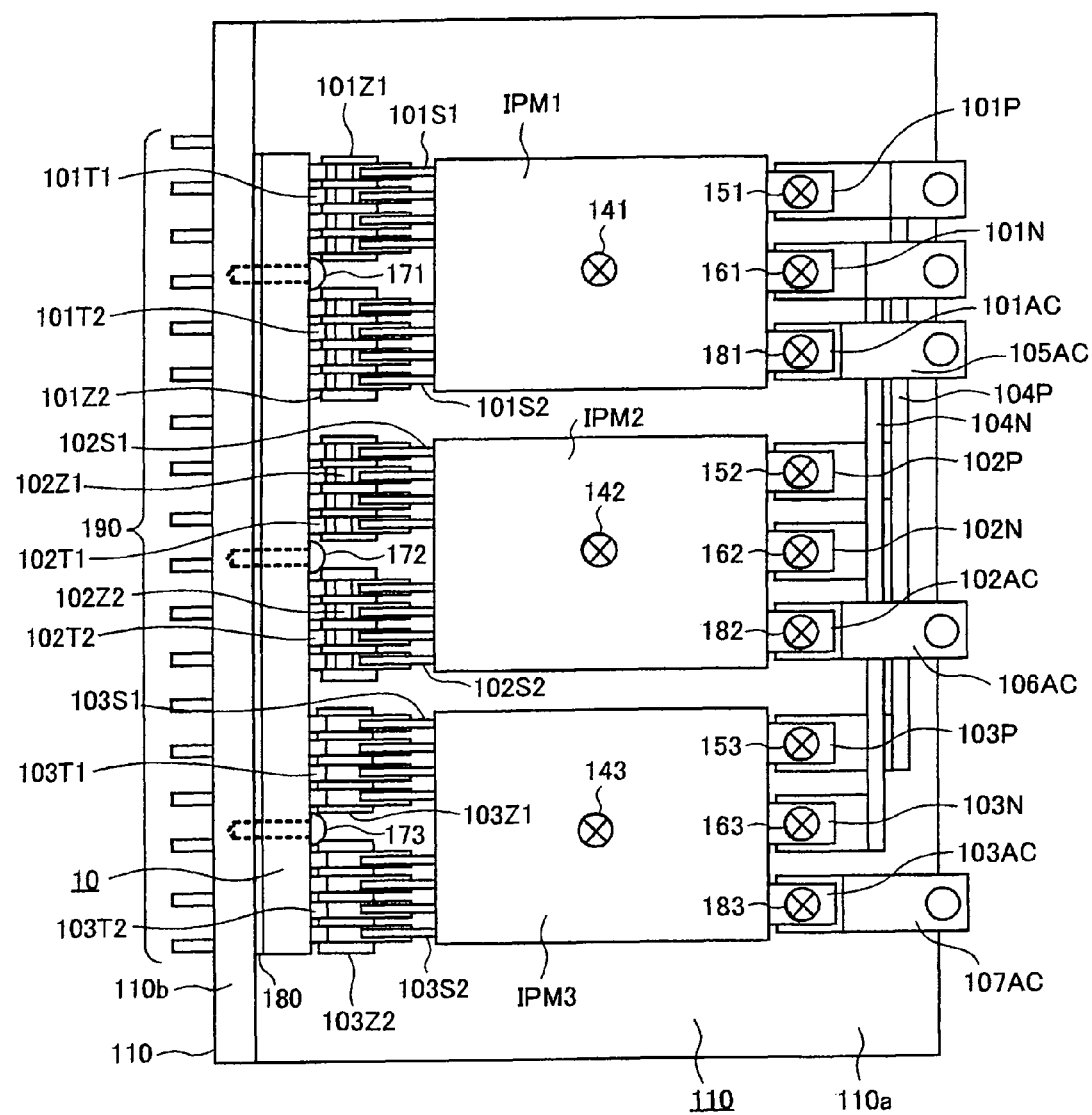
FIG. 2 is a plan view of the power conversion apparatus according to Embodiment 1 of this invention.
Figure 3:
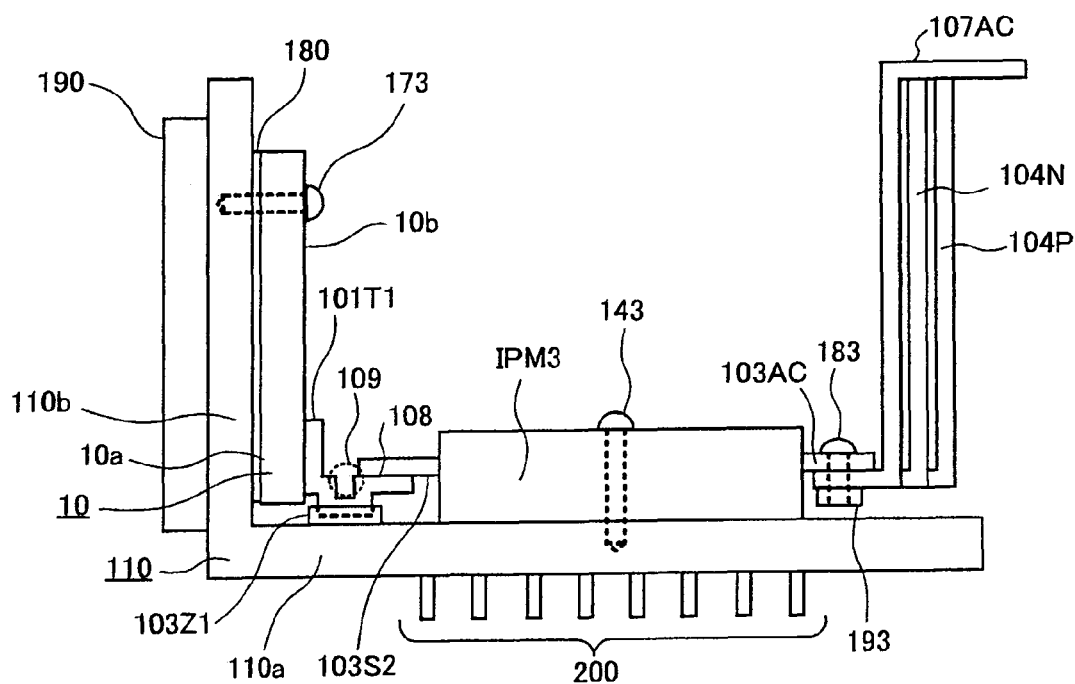
FIG. 3 is a side view of the power conversion apparatus according to Embodiment 1 of this invention.

FIGS. 2 and 3 show the power conversion apparatus according to Embodiment 1 of this invention as includes the principal portions of the power conversion circuit shown in FIG. 1. FIG. 2 is a plan view of the power conversion apparatus, and FIG. 3 is a side view thereof. Parts corresponding to those in FIG. 1 are assigned the same numerals and signs as in FIG. 1.

Referring to FIGS. 2 and 3, a base 110 includes a first flat fixation portion 110a and a second flat fixation portion 110b which are coupled defining an angle of 90 degrees, and it is formed having a substantially L-shaped section as seen from FIG. 3. Although both the fixation portions 110a and 110b of the base 110 are formed of a unitary metal plate, the base 110 may well be configured in such a way that the respective fixation portions 110a and 110b formed of separate metal plates are coupled by welding or the like. The bottom surface of the first fixation portion 110a of the base 110 is unitarily provided with a plurality of radiation fins 200 made of protuberant bars, while the side part of the second fixation portion 110b is unitarily provided with a plurality of radiation fins 190 made of protuberant bars.

The radiation fins 200 provided unitarily with the first fixation portion 110a of the base 110, chiefly emit heats generated by the power modules IPM1, IPM2 and IPM3 as have been conducted to the first fixation portion 110a of the base 110, by bringing them into touch with a coolant such as water, liquid or air, not shown. Besides, the radiation fins 190 provided unitarily with the second fixation portion 110b of the base 110, chiefly emit heats generated by the electronic components, the electric components, etc. packaged on the control circuit board 10, to a coolant such as water, liquid or air, not shown.

The power modules IPM1, IPM2 and IPM3 are respectively fixed by screws 141, 142 and 143 with their bottom surfaces held in touch with the first fixation portion 110a of the base 110. The screws 141, 142 and 143 are clamped in threadable engagements with threaded holes (not shown) machined in the first fixation portion 110a of the base 110. The power modules IPM1, IMP2 and IMP3 are respectively provided with the P-electrode side main terminals 101P, 102P and 103P, as well as the N-electrode side main terminals 101N, 102N and 103N, and the AC side main terminals 101AC, 102AC and 103AC. Further, the power modules IPM1, IMP2 and IMP3 are respectively provided with the pairs of signal electrode terminals 101S1 and 101S2, 102S1 and 102S2, and 103S1 and 103S2 for conducting the control signals which control the pairs of included power semiconductor elements.

The control circuit board 10 has its first principal surface 10a bonded to the second fixation portion 110b of the base 110 over the whole area thereof by an adhesive 180, and it is fixed to the second fixation portion 110b of the base 110 by screws 171, 172 and 173. The respective screws 171, 172 and 173 are clamped in threadable engagements with threaded holes machined in the second fixation portion 110b of the base 110. Besides, the components such as electronic components and electric components (not shown) which constitute the control circuit for the switching controls of the power semiconductor elements included in the power modules IPM1, IPM2 and IPM3 are packaged on the second principal surface 10b of the control circuit board 10.

Terminal members 101T1 and 101T2, 102T1 and 102T2, and 103T1 and 103T2 are packaged on the second principal surface 10b of the control circuit board 10. Each of the terminal members 101T1 and 101T2, 102T1 and 102T2, and 103T1 and 103T2 is formed of four pieces of electrically conductive material, and the four pieces of the electrically conductive material are unitarily secured by the corresponding one of insulating members 101Z1 and 101Z2, 102Z1 and 102Z2, and 103Z1 and 103Z2 which are fixed to the first fixation portion 110a of the base 110. The insulating members 101Z1 and 101Z2, 102Z1 and 102Z2, and 103Z1 and 103Z2 are formed by, for example, insert-molding a resin material.

The four pieces of the electrically conductive material as constitute the corresponding one of the terminal members 101T1 and 101T2, 102T1 and 102T2, and 103T1 and 103T2 are formed substantially in the shape of letter L. Each of the four pieces is formed with a crooked portion 109 on one side thereof, whereby a mechanical displacement developing in the electrically conductive material due to vibrations or the difference of thermal expansions is absorbed by the crooked portion 109.

The crooked portion 109 is formed by any working method other than bending, such as punching, laser cutting, wire discharging, or turret punch pressing. In the case where the crooked portion 109 is formed by such a working method other than the bending, a dimensional deviation after the working can be much more suppressed than in the working by the bending (that is, a dimensional precision can be enhanced). Therefore, the step of adjustments which are required in the insertion of the terminal into a joint part and the positioning of the terminal in the ordinary assembling process of the terminal is dispensed with, and the facilitation and high efficiency of the assembling job of the terminal can be realized.

The signal electrode terminals 101S1 and 101S2, 102S1 and 102S2, and 103S1 and 103S2 of the power modules IPM1, IPM2 and IMP3 are secured by brazing 108 and electrically connected to the respectively corresponding terminal members 101T1 and 101T2, 102T1 and 102T2, and 103T1 and 103T2. Incidentally, soldering or welding may well be employed instead of the brazing.

The P-electrode side main terminals 101P, 102P and 103P of the power modules IPM1, IPM2 and IPM3 are respectively fixed by co-clamping and electrically connected to a bus bar 104P, by screws 151, 152 and 153, thereby to be connected to the P-electrode of the battery. Likewise, the N-electrode side main terminals 101N, 102N and 103N are respectively fixed by co-clamping and electrically connected to a bus bar 104N, by screws 161, 162 and 163, thereby to be connected to the N-electrode of the battery.

In addition, the AC side main terminals 101AC, 102AC and 103AC of the power modules IPM1, IPM2 and IPM3 are respectively fixed and electrically connected to the bus bars 105AC, 106AC and 107AC by the screws 181, 182 and 183. The bus bars 105AC, 106AC and 107AC are connected to the stator windings U, V and W of the brushless DC motor 8 as shown in FIG. 1.

As seen from FIG. 3, the respective screws 151, 152, 153, 161, 162, 163, 181, 182 and 183 are clamped in threadable engagements with nuts 193. The nuts 193 are unitarily assembled and arranged in a terminal bed, not shown, which is made of an electrically insulating material.

The first fixation portion 110a and second fixation portion 110b of the base 110 are coupled at the angle of 90 degrees as stated before. In Embodiment 1, the angle of 90 degrees is the optimum angle suitable for the shape, etc. of an installation location where the power conversion apparatus is arranged, for example, an installation location in the engine room of a vehicle.

If the shape, etc. of the installation location where the power conversion apparatus is installed are more suitable when the first fixation portion 110a and second fixation portion 110b of the base 110 are coupled at any angle other than 90 degrees, the base in which the first fixation portion 110a and the second fixation portion 110b are connected at the suitable angle is formed. In this case, by way of example, a plurality of bases in which the angles defined between the first fixation portion 110a and second fixation portion 110b of the base 110 are different may be prepared so as to select the base having the optimum angle, from among the bases. Alternatively, the coupling between the first fixation portion 110a and second fixation portion 110b of the base 110 may be mechanically adjusted or changed so as to adjust the angle.

The power conversion apparatus according to Embodiment 1 of this invention configured as described above is mounted in the predetermined location of the vehicle or the like. In this regard, the first fixation portion 110a and second fixation portion 110b of the base 110 are coupled at 90 degrees being the angle which is suitable for the condition of the space part of the mounting location, other structures, or the like, so that the apparatus can be mounted in the optimum arrangement suitable for the mounting location. Besides, if the power conversion apparatus is mounted in a location of different mechanical condition, the base in which the first fixation portion and the second fixation portion are connected at a desired angle suitable for the condition is configured, whereby the optimum arrangement suitable for the condition can be established. In the case of Embodiment 1, the base 110 is configured of the first fixation portion 110a and second fixation portion 110b which have the simple flat shapes, so that the base 110 can be altered very easily.

Moreover, in accordance with the power conversion apparatus according to Embodiment 1, the control circuit board 10 has its first principal surface bonded to the second fixation portion 110b of the base 110 over the whole area by the adhesive 180, and it is fixed by the screws 171, 172 and 173, so that the control circuit board 10 does not incur resonance as in the prior art and does not exert evil influence on the packaged components. Furthermore, the heat dissipation of the control circuit board 10 proceeds very effectively, and the influences of heats on the packaged components, etc. can be lessened.

Embodiment 2

Figure 4:
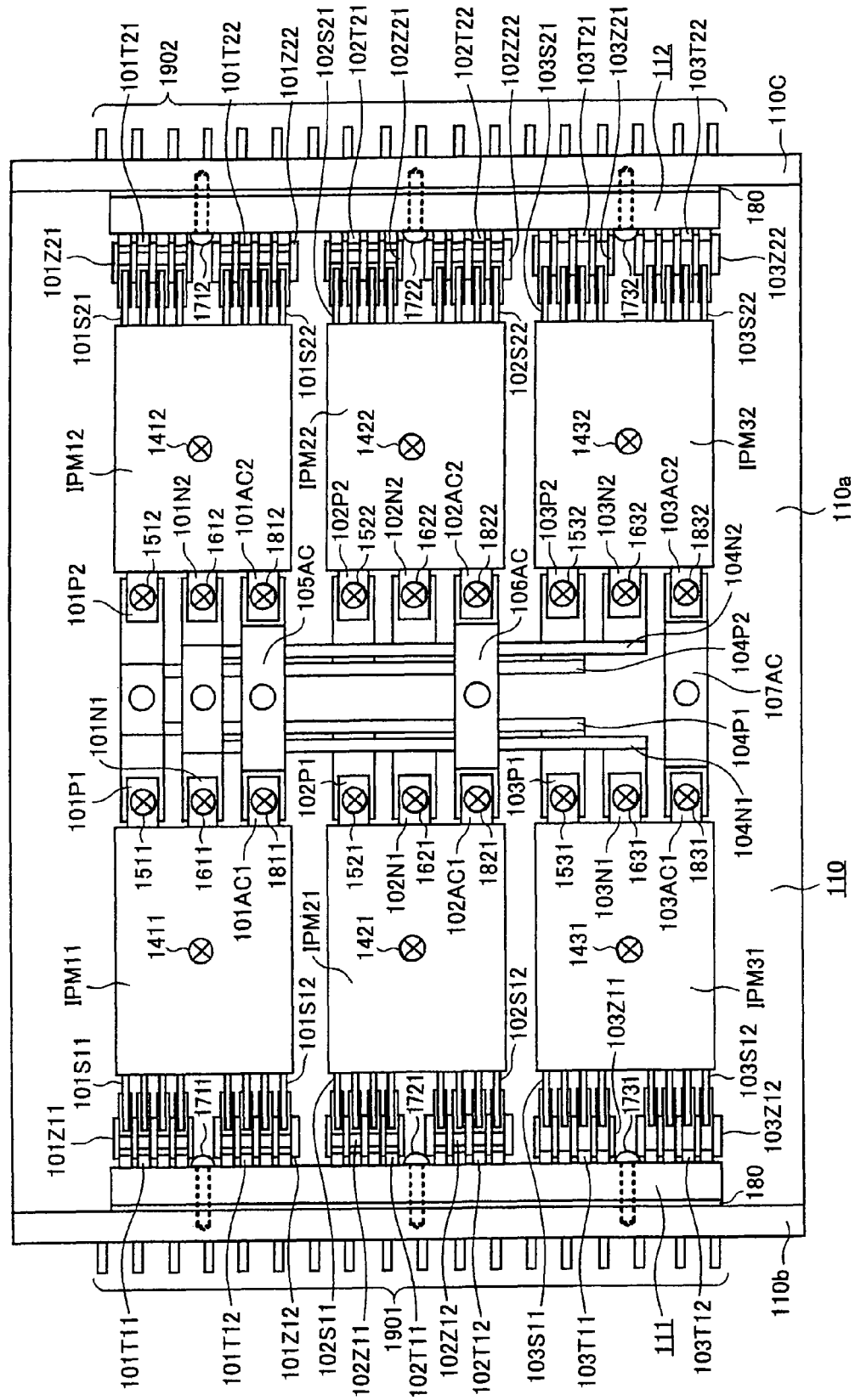
FIG. 4 is a plan view of a power conversion apparatus according to Embodiment 2 of this invention.
Figure 5:
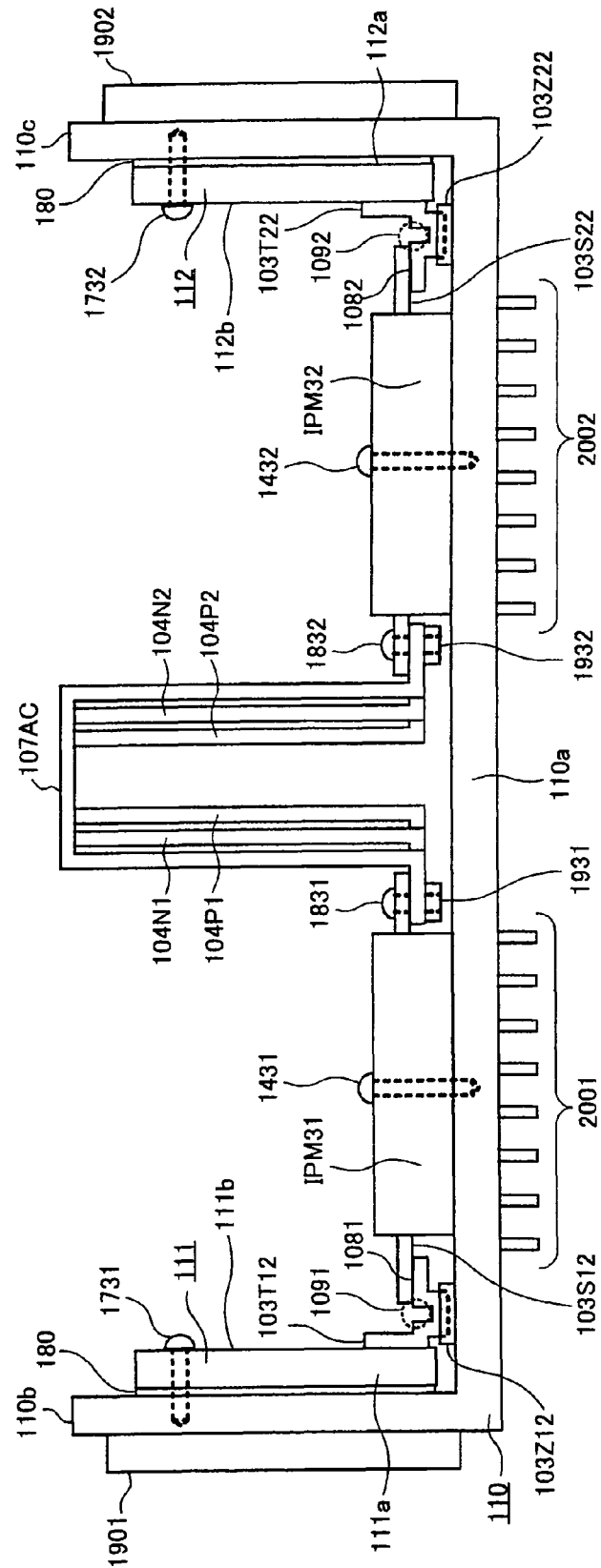
FIG. 5 is a side view of the power conversion apparatus according to Embodiment 2 of this invention.

FIGS. 4 and 5 show a power conversion apparatus according to Embodiment 2 of this invention, and FIG. 4 is a plan view of the apparatus, while FIG. 5 is a side view thereof.

Embodiment 2 consists in that two power modules IPM11 and IPM12, IPM21 and IPM22, or IPM31 and IPM32 forming one set are electrically connected in parallel, for each phase of the stator winding U, V or W of a three-phase brushless DC motor, so as to drive the motor which is a load of higher power.

Referring to FIGS. 4 and 5, the power modules IPM11 and IPM12, IPM21 and IPM22, and IPM31 and IPM32 form pairs, and they are fixed by screws 1411 and 1412, 1421 and 1422, and 1431 and 1432 with their bottom surfaces held in touch with the first fixation portion 110a of a base 110, respectively. The respective screws are clamped in threadable engagements with threaded holes which are provided in the first fixation portion 110a of the base 110.

The base 110 is configured of the first flat fixation portion 110a, a second flat fixation portion 110b which is coupled to one end of the first fixation portion 110a, and a third flat fixation portion 110c which is coupled to the other end of the first fixation portion 110a. The first fixation portion 110a and the second fixation portion 110b are coupled at an angle of 90 degrees, while the first fixation portion 110a and the third fixation portion 110c are similarly coupled at the angle of 90 degrees. Although all the fixation portions 110a, 110b and 110c of the base 110 are formed of a unitary metal plate, the base 110 may well be configured in such a way that the respective fixation portions 110a, 110b and 110c formed of separate metal plates are coupled by welding or the like.

The bottom surface of the first fixation portion 110a of the base 110 is unitarily provided with radiation fins 2001 and 2002 made of pluralities of protuberant bars, the side part of the second fixation portion 110b is unitarily provided with radiation fins 1901 made of a plurality of protuberant bars, and the side part of the third fixation portion 110c is unitarily provided with radiation fins 1902 made of a plurality of protuberant bars.

The radiation fins 2001 and 2002 provided unitarily with the first fixation portion 110a of the base 110, chiefly emit heats generated by the power modules IPM11 and IPM12, IPM21 and IPM22, and IPM31 and IPM32 as have been conducted to the first fixation portion 110a of the base 110, by bringing them into touch with a coolant such as water, liquid or air, not shown. Besides, the radiation fins 1901 and 1902 provided unitarily with the second fixation portion 110b and third fixation portion 110c of the base 110, chiefly emit heats generated by electronic components, electric components, etc. packaged on a first control circuit board 111 and a second control circuit board 112, to a coolant such as water, liquid or air, not shown, respectively.

The power modules IPM11 and IPM12, IMP21 and IPM22, and IMP31 and IPM32 are respectively provided with P-electrode side main terminals 101P1 and 101P2, 102P1 and 102P2, and 103P1 and 103P2, as well as N-electrode side main terminals 101N1 and 101N2, 102N1 and 102N2, and 103N1 and 103N2, and AC side main terminals 110AC1 and 101AC2, 102AC1 and 102AC2, and 103AC1 and 103AC2. Further, the power modules IPM11 and IPM12, IMP21 and IPM22, and IMP31 and IPM32 are respectively provided with pairs of signal electrode terminals 101S11 and 101S12, 101S21 and 101S22, 102S11 and 102S12, 102S21 and 102S22, 103S11 and 103S12, and 103S21 and 103S22 for conducting control signals which control pairs of included power semiconductor elements.

The first control circuit board 111 has its first principal surface 111a bonded to the second fixation portion 110b of the base 110 over the whole area thereof by an adhesive 180, and it is fixed to the second fixation portion 110b of the base 110 by screws 1711, 1721 and 1731. The respective screws 1711, 1721 and 1731 are clamped in threadable engagements with threaded holes machined in the second fixation portion 110b of the base 110. Besides, the components such as electronic components and electric components (not shown) which constitute a control circuit for the switching controls of the power semiconductor elements included in the power modules IPM11, IPM21 and IPM31 are packaged on the second principal surface 111b of the first control circuit board 111.

Likewise, the second control circuit board 112 has its first principal surface 112a bonded to the third fixation portion 110c of the base 110 over the whole area thereof by an adhesive 180, and it is fixed to the third fixation portion 110c of the base 110 by screws 1712, 1722 and 1732. The respective screws 1712, 1722 and 1732 are clamped in threadable engagements with threaded holes machined in the third fixation portion 110c of the base 110. Besides, the components such as electronic components and electric components (not shown) which constitute a control circuit for the switching controls of the power semiconductor elements included in the power modules IPM12, IPM22 and IPM32 are packaged on the second principal surface 112b of the second control circuit board 112.

In addition, terminal members 101T11 and 101T12, 102T11 and 102T21, and 103T11 and 103T21 are packaged on the second principal surface 111b of the first control circuit board 111. Each of the terminal members 101T11 and 101T12, 102T11 and 102T12, and 103T11 and 103T12 is formed of four pieces of electrically conductive material, and the four pieces of the electrically conductive material are unitarily secured by the corresponding one of insulating members 101Z11 and 101Z12, 102Z11 and 102Z12, and 103Z11 and 103Z12 which are fixed to the first fixation portion 110a of the base 110.

Likewise, terminal members 101T21 and 101T22, 102T21 and 102T22, and 103T21 and 103T22 are packaged on the second principal surface 112b of the second control circuit board 112. Each of the terminal members 101T21 and 101T22, 102T21 and 102T22, and 103T21 and 103T22 is formed of four pieces of electrically conductive material, and the four pieces of the electrically conductive material are unitarily secured by the corresponding one of insulating members 101Z21 and 101Z22, 102Z21 and 102Z22, and 103Z21 and 103Z22 which are fixed to the first fixation portion 110a of the base 110. The insulating members 101Z21 and 101Z22, 102Z21 and 102Z22, and 103Z21 and 103Z22 are formed by, for example, insert-molding a resin material.

The four pieces of the electrically conductive material as constitute the corresponding one of the terminal members 101T11 and 101T12, 102T11 and 102T12, and 103T11 and 103T12 are formed substantially in the shape of letter L, and each of the four pieces is formed with a crooked portion 1091 on one side thereof. Likewise, the four pieces of the electrically conductive material as constitute the corresponding one of the terminal members 101T21 and 101T22, 102T21 and 102T22, and 103T21 and 103T22 are formed substantially in the shape of letter L, and each of the four pieces is formed with a crooked portion 1092 on one side thereof. Mechanical displacements developing in the electrically conductive material due to vibrations or the difference of thermal expansions are absorbed by the crooked portions 1091 and 1092.

The crooked portions 1091 and 1092 are formed by any working method other than bending, such as punching, laser cutting, wire discharging, or turret punch pressing. In the case where the crooked portions are formed by such a working method other than the bending, dimensional deviations after the working can be much more suppressed than in the working by the bending (that is, dimensional precisions can be enhanced). Therefore, the step of adjustments which are required in the insertion of the terminal into a joint part and the positioning of the terminal in the ordinary assembling process of the terminal is dispensed with, and the facilitation and high efficiency of the assembling job of the terminal can be realized.

The signal electrode terminals 101S11 and 101S12, 102S11 and 102S12, and 103S11 and 103S12 of the power modules IPM11, IPM21 and IMP31 are secured by brazing 1081 and electrically connected to the respectively corresponding terminal members 101T11 and 101T12, 102T11 and 102T12, and 103T11 and 103T12. Incidentally, soldering or welding may well be employed instead of the brazing.

Likewise, the signal electrode terminals 101S21 and 101S22, 102S21 and 102S22, and 103S21 and 103S22 of the power modules IPM12, IPM22 and IMP32 are secured by brazing 1082 and electrically connected to the respectively corresponding terminal members 101T21 and 101T22, 102T21 and 102T22, and 103T21 and 103T22. Incidentally, soldering or welding may well be employed instead of the brazing.

The P-electrode side main terminals 101P1, 102P1 and 103P1 of the power modules IPM11, IPM21 and IPM31 are respectively fixed by co-clamping and electrically connected to a bus bar 104P1, by screws 1511, 1521 and 1531, thereby to be connected to the P-electrode of a battery. In like fashion, the N-electrode side main terminals 101N1, 102N1 and 103N1 are respectively fixed by co-clamping and electrically connected to a bus bar 104N1, by screws 1611, 1621 and 1631, thereby to be connected to the N-electrode of the battery.

Likewise, the P-electrode side main terminals 101P2, 102P2 and 103P2 of the power modules IPM12, IPM22 and IPM32 are respectively fixed by co-clamping and electrically connected to a bus bar 104P2, by screws 1512, 1522 and 1532, thereby to be connected to the P-electrode of the battery. In like fashion, the N-electrode side main terminals 101N2, 102N2 and 103N2 are respectively fixed by co-clamping and electrically connected to a bus bar 104N2, by screws 1612, 1622 and 1632, thereby to be connected to the N-electrode of the battery.

In addition, the AC side main terminals 110AC1, 102AC1 and 103AC1 of the power modules IPM11, IPM21 and IPM31 are respectively fixed and electrically connected to bus bars 105AC, 106AC and 107AC by screws 1811, 1821 and 1831. The bus bars 105AC, 106AC and 107AC are connected to the stator windings U, V and W of the brushless DC motor 8 as shown in FIG. 1.

Likewise, the AC side main terminals 101AC2, 102AC2 and 103AC2 of the power modules IPM12, IPM22 and IPM32 are respectively fixed and electrically connected to the bus bars 105AC, 106AC and 107AC by screws 1812, 1822 and 1832.

As seen from FIG. 5, the respective screws 1511, 1521, 1531, 1611, 1621, 1631, 1811, 1821 and 1831, and 1512, 1522, 1532, 1612, 1622, 1632, 1812, 1822 and 1832 are clamped in threadable engagements with nuts 1931 and 1932.

The nuts 1931 and 1932 are unitarily assembled and arranged in a terminal bed, not shown, which is made of an electrically insulating material.

The first fixation portion 110*a* and second fixation portion 110*b*, and the first fixation portion 110*a* and third fixation portion 110*c* of the base 110 are respectively coupled at the angles of 90 degrees as stated before. In Embodiment 2, the angles of 90 degrees are the optimum angles suitable for the shape, etc. of an installation location where the power conversion apparatus is arranged, for example, an installation location in the engine room of a vehicle.

If the shape, etc. of the installation location where the power conversion apparatus is installed are more suitable when the first fixation portion 110*a* and second fixation portion 110*b* of the base 110 are coupled at any angle other than 90 degrees, the base in which the first fixation portion 110*a* and the second fixation portion 110*b* are connected at the suitable angle is formed. Besides, if the shape, etc. are more suitable when the first fixation portion 110*a* and third fixation portion 110*c* of the base 110 are coupled at any angle other than 90 degrees, the base in which the first fixation portion 110*a* and the third fixation portion 110*c* are connected at the suitable angle is formed.

In this case, by way of example, a plurality of bases in which the angles defined between the first fixation portion 110*a* and second fixation portion 110*b* of the base 110, and the angles defined between the first fixation portion 110*a* and third fixation portion 110*c* are different may be prepared so as to select the base having the optimum angles, from among the bases. Alternatively, the coupling between the first fixation portion 110*a* and second fixation portion 110*b* of the base 110, and the coupling between the first fixation portion 110*a* and third fixation portion 110*c* may be mechanically adjusted or changed so as to adjust the angles.

The power conversion apparatus according to Embodiment 2 of this invention configured as described above is mounted in the predetermined location of the vehicle or the like. In this regard, the first fixation portion 110*a* and second fixation portion 110*b* of the base 110 are coupled at 90 degrees being the angle which is suitable for the condition of the space part of the mounting location, other structures, or the like, so that the apparatus can be mounted in the optimum arrangement suitable for the mounting location. Besides, if the power conversion apparatus is mounted in a location of different mechanical condition, the base in which the first fixation portion 110*a* and second fixation portion 110*b*, and the first fixation portion 110*a* and third fixation portion 110*c* are connected at desired angles suitable for the condition is configured, whereby the optimum arrangement suitable for the condition can be established. In the case of Embodiment 2, the base 110 is configured of the first fixation portion 110*a*, second fixation portion 110*b* and third fixation portion 110*c* which have the simple flat shapes, so that the base 110 can be altered very easily.

Furthermore, in accordance with the power conversion apparatus according to Embodiment 2, even in a case where a power conversion circuit is configured by combining a large number of power modules, control circuit boards on which the corresponding power modules and control circuits therefore are packaged can be dispersedly arranged on the plurality of fixation portions of a base. Also, the respective control circuit boards 111 and 112 have their first principal surfaces bonded to the second fixation portion 110*b* and third fixation portion 110*c* of the base 110 over the whole areas by the adhesives 180, and they are fixed by the screws 1711, 1721 and 1731, and 1712, 1722 and 1732. Therefore, the control circuit boards 111 and 112 do not incur resonances as in the prior art and do not exert evil influences on the packaged components. Moreover, the heat dissipations of the control circuit boards 111 and 112 proceed very effectively, and the influences of heats on the packaged components, etc. can be lessened.

Embodiment 3

Figure 6:
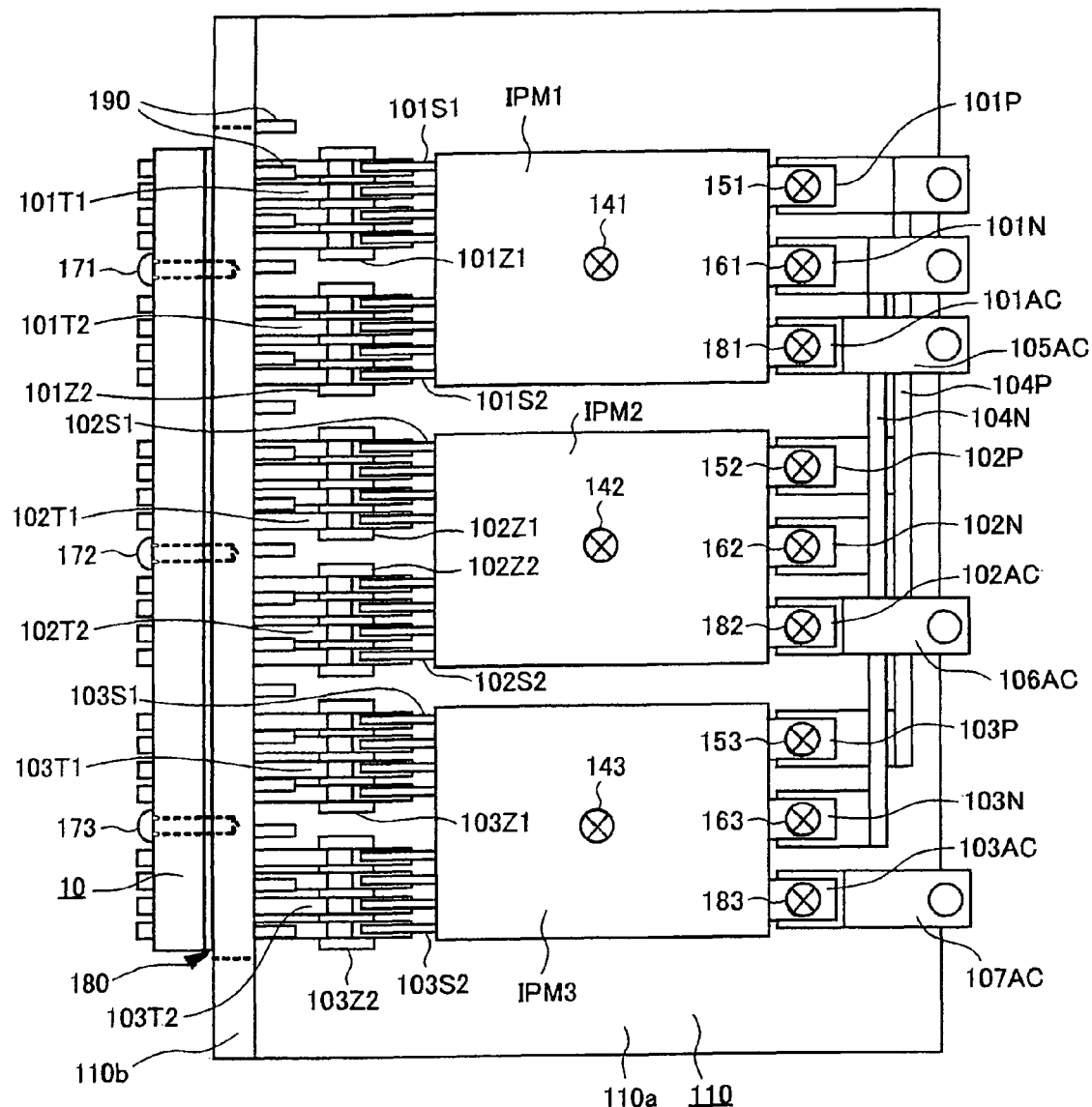
FIG. 6 is a plan view of a power conversion apparatus according to Embodiment 3 of this invention.
Figure 7:
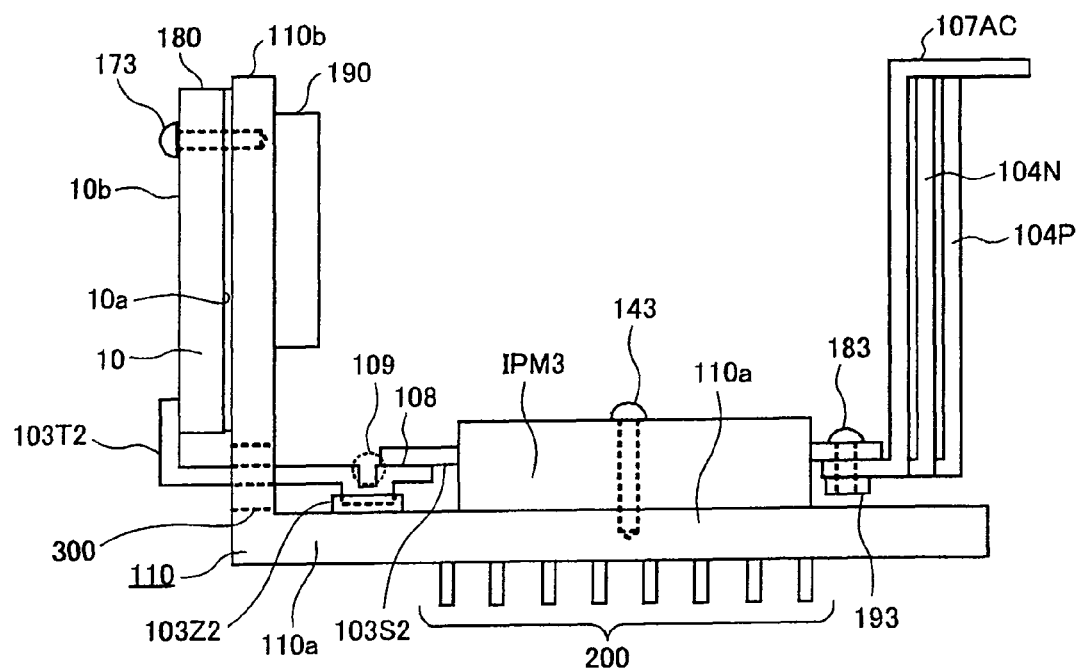
FIG. 7 is a side view of the power conversion apparatus according to Embodiment 3 of this invention.

FIGS. 6 and 7 show a power conversion apparatus according to Embodiment 3 of this invention, and FIG. 6 is a plan view of the apparatus, while FIG. 7 is a side view thereof. Embodiment 3 consists in that one power module IPM1, IPM2 or IPM3 is arranged for the corresponding one of the stator windings of a three-phase brushless DC motor.

Referring to FIGS. 6 and 7, a control circuit board 10 has its first principal surface 10*a* bonded to the outer side of the second fixation portion 110*b* of a base 110 over the whole area by an adhesive 180, and it is fixed by screws 171, 172 and 173. Electronic components, electric components, etc. which constitute a control circuit for the switching controls of power semiconductor elements included in the power modules IPM1, IPM2 and IPM3 are packaged on the second principal surface 10*b* of the control circuit board 10.

Terminals 101T1 and 101T2, 102T1 and 102T2, and 103T1 and 103T2 which are packaged on the second principal surface 10*b* of the control circuit board 10, penetrate through penetrating holes 300 provided in the second fixation portion 110*b* of the base 110 and are led onto the inner side of the second fixation portion 110*b* of the base 110, so as to be connected by brazing to the corresponding signal electrode terminals 101S1 and 101S2, 102S1 and 102S2, and 103S1 and 103S2 of the power modules IPM1, IPM2 and IPM3, respectively.

The inner side of the second fixation portion 110*b* of the base 110 is unitarily provided with radiation fins 190 which are made of a plurality of protuberant bars. The radiation fins 190 chiefly emit heats generated by the electronic components, the electric components, etc. packaged on the control circuit board 10, to a coolant such as water, liquid or air, not shown.

Incidentally, the remaining configuration is the same as in Embodiment 1, and identical numerals and signs indicate identical or corresponding portions, respectively.

The power conversion apparatus according to Embodiment 3 of this invention configured as described above is mounted in the predetermined location of a vehicle or the like, similarly to the power conversion apparatus according to Embodiment 1. In this regard, the first fixation portion 110*a* and second fixation portion 110*b* of the base 110 are coupled at 90 degrees being an angle which is suitable for the condition of the space part of the mounting location, other structures, or the like, so that the apparatus can be mounted in the optimum arrangement suitable for the mounting location. Besides, if the power conversion apparatus is mounted in a location of different mechanical condition, the base in which the first fixation portion 110*a* and second fixation portion 110*b* are connected at a desired angle suitable for the condition is configured, whereby the optimum arrangement suitable for the condition can be established. In the case of Embodiment 3, the base 110 is configured of the first fixation portion 110*a* and second fixation portion 110*b* which have simple flat shapes, so that the base 110 can be altered very easily.

In addition, the control circuit board 10 has its first principal surface bonded to the second fixation portion 110*b* of the base 110 over the whole area by the adhesive 180, and it is fixed by the screws 171, 172 and 173, so that the control circuit board 10 does not incur resonance as in the prior art and does not exert evil influence on the packaged components. Furthermore, the heat dissipation of the control circuit board 10 proceeds very effectively, and the influences of heats on the packaged components, etc. can be lessened.

Incidentally, two such power conversion apparatuses according to Embodiment 3 as shown in FIGS. 6 and 7 may well be arranged in opposition as one set, so as to arrange two power modules for the corresponding phase of the stator windings of a motor for the purpose of driving the motor being a load of high power, as illustrated in Embodiment 2.

Various modifications and alterations of this invention will be apparent to those skilled in the art without departing from the scope and sprit of this invention, and it should be understood that this is not limited to the illustrative embodiments set forth herein.

What is claimed is:

1. A power conversion apparatus comprising
power modules which include semiconductor elements constituting a power conversion circuit for converting powers between DC and AC;
a control circuit board on which components constituting a control circuit for driving and controlling said semiconductor elements are packaged;
bus bars which connect said power conversion circuit and an external equipment; and
a base on which, at least, said power modules and said control circuit board are fixed,
wherein said base includes a first fixation portion and a second fixation portion which are coupled to each other at an angle,
wherein said power modules are fixed on said first fixation portion of said base,
wherein a first principal surface of said control circuit board extends along the second fixation portion and is held in direct or indirect contact with said second fixation portion of said base, and
wherein said components are packaged on a second principal surface of said control circuit board.

2. A power conversion apparatus as defined in claim 1, wherein said control circuit board is fixed to said second fixation portion of said base by at least either of an adhesive and screws.

3. The power conversion apparatus as defined in claim 1, wherein the first fixed portion and the second fixed portion have fins.

4. The power conversion apparatus as defined in claim 1, wherein the second fixed portion has fins on an outer surface and wherein inner surface of the second fixed portion is directly fixed to said control circuit board via adhesive or screws.

5. The power conversion apparatus as defined in claim 1, wherein said control circuit board is fixed to an inner surface of the second fixed portion.

6. The power conversion apparatus as defined in claim 1, wherein said control circuit board is positioned not to be parallel to the power modules.

7. The power conversion apparatus as defined in claim 1, wherein said control circuit board is fixed to said second fixation portion of said base by an adhesive and screws.

8. The power conversion apparatus as defined in claim 1, wherein larger part of said first principal surface is fixed to the second fixation portion.

9. A power conversion apparatus comprising:
power modules which include semiconductor elements constituting a power conversion circuit for converting powers between DC and AC,
a control circuit board on which components constituting a control circuit for driving and controlling said semiconductor elements are packaged,
bus bars which connect said power conversion circuit and an external equipment, and
a base on which, at least, said power modules and said control circuit board are fixed;
wherein said base includes a first fixation portion and a second fixation portion which are coupled to each other at an angle, said power modules are fixed on said first fixation portion of said base, a first principal surface of the control circuit board is held in direct or indirect contact with said second fixation portion of said base, and said components are packaged on a second principal surface of said control circuit board, and
wherein the power conversion apparatus further comprises terminal members which transfer signals between said control circuit board and said power modules, wherein said terminal members include crooked portions which absorb mechanical displacements of said terminal members.

10. A power conversion apparatus as defined in claim 9, wherein said crooked portions are formed in said terminal members by a working method other than bending.

11. A power conversion apparatus as defined in claim 9, wherein said terminal members are formed in a plurality of arrays, and said terminal members are unitarily fixed to one another through electrically insulating members.

12. A power conversion apparatus as defined in claim 9, wherein said terminal members are packaged and fixed on said control circuit board.

13. A power conversion apparatus as defined in claim 9, wherein said terminal members are electrically connected to signal electrode terminals provided on said power modules, by at least one of brazing, soldering and welding.

* * * * *